United States Patent
Kundalgurki

(10) Patent No.: US 7,208,095 B2
(45) Date of Patent: Apr. 24, 2007

(54) METHOD FOR FABRICATING BOTTOM ELECTRODES OF STACKED CAPACITOR MEMORY CELLS AND METHOD FOR CLEANING AND DRYING A SEMICONDUCTOR WAFER

(75) Inventor: Srivatsa Kundalgurki, Dresden (DE)

(73) Assignee: Infineon Technologies AG, Munich (DE)

( * ) Notice: Subject to any disclaimer, the term of this patent is extended or adjusted under 35 U.S.C. 154(b) by 198 days.

(21) Appl. No.: 11/011,038

(22) Filed: Dec. 15, 2004

(65) Prior Publication Data

US 2006/0124582 A1    Jun. 15, 2006

(51) Int. Cl.
*H01B 13/00* (2006.01)
*H01L 21/00* (2006.01)

(52) U.S. Cl. .............. 216/13; 216/67; 216/88; 216/41; 438/692; 438/706

(58) Field of Classification Search .......... 21/41, 21/58, 67, 88, 79; 438/692, 706, 710
See application file for complete search history.

(56) References Cited

U.S. PATENT DOCUMENTS 7,018,893 B1 * 3/2006 Kundalgurki ............... 438/254
2002/0072223 A1 * 6/2002 Gilbert et al. .............. 438/629
2005/0287755 A1 * 12/2005 Bachmann et al. ......... 438/381

OTHER PUBLICATIONS

C.H. Mastrangelo, Mechanical Stability and Adhesion of Microstructures Under Capillary Forces—Part I: Basic Theory, Journal of Microelectromechanical Systems, vol. 2, No. 1, Mar. 1993, pp. 33-43.
C.H. Mastrangelo, Suppression of Stiction in MEMS, 1999 Spring MRS Meeting, Boston, MA, 1999, pp. 1-12.
Jung-Mu Kim et al., Continuous Anti-Stiction Coatings Using Self-Assembled Monolayers for Gold Microstructures, Journal of Micromechanics and Microengineerring, 12 (2002) pp. 688-695.

* cited by examiner

*Primary Examiner*—Shamim Ahmed
(74) *Attorney, Agent, or Firm*—Edell, Shapiro & Finnan, LLC

(57) ABSTRACT

Bottom electrodes of stacked capacitor DRAM cells are formed by depositing a metal layer on the side walls of trenches within a hard mask layer, which serves as a mold for the bottom electrode elements. Prior to depositing the hard mask layer a sacrificial first metal layer is disposed, which leads to a electrical conductive surface on the semiconductor wafer. The mask layer is wet-etched to release the bottom electrode as free standing elements on the semiconductor surface. Using the conductive path provided by the first and the second metal layer, the bottom electrodes are polarized in a cleaning liquid bath during a wafer drying process. The generated repulsive electric field overcomes the attractive forces between the neighboring bottom electrode elements induced due to capillary effects of the liquids used for etching and cleaning.

21 Claims, 9 Drawing Sheets

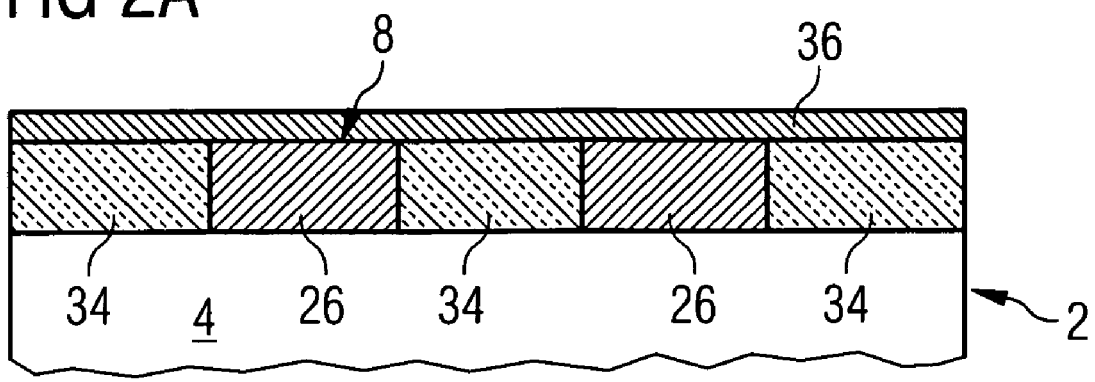
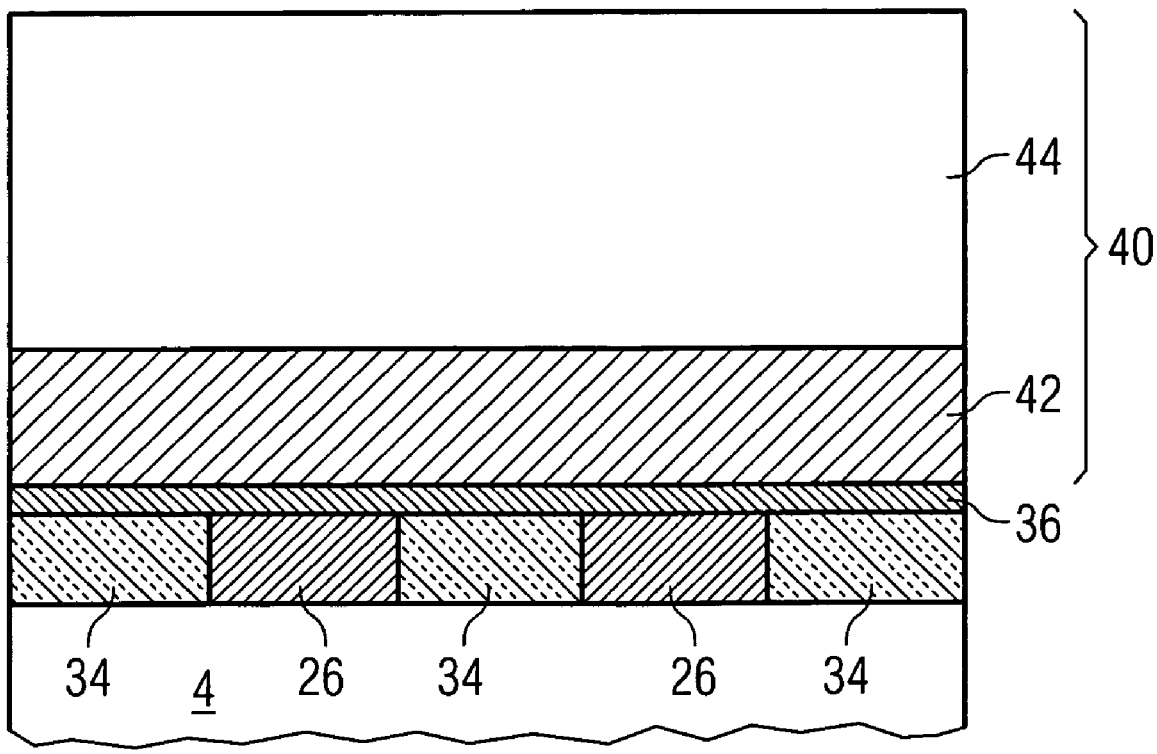

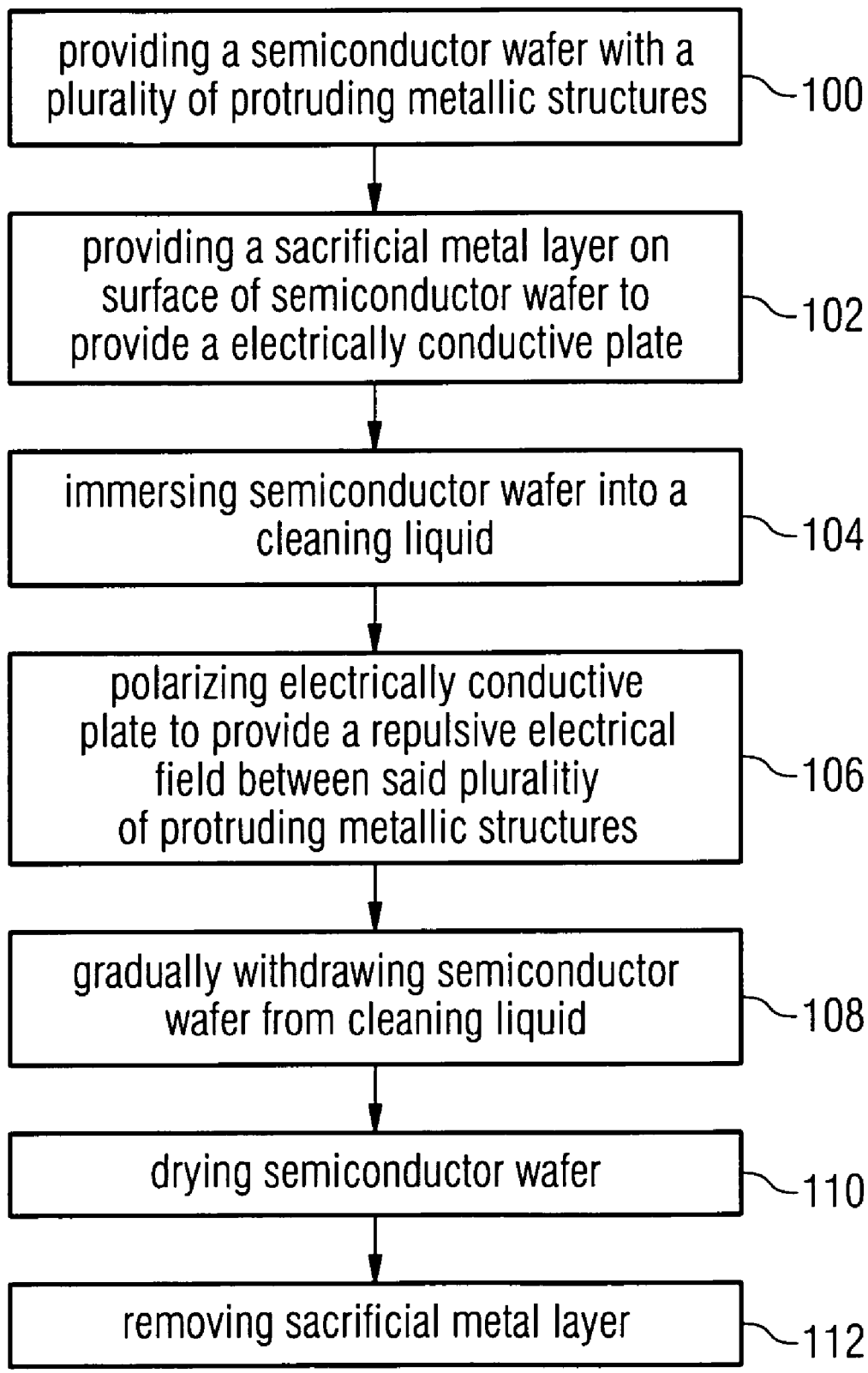

METHOD FOR FABRICATING BOTTOM ELECTRODES OF STACKED CAPACITOR MEMORY CELLS AND METHOD FOR CLEANING AND DRYING A SEMICONDUCTOR WAFER

FIELD OF THE INVENTION

The invention relates to a method for fabricating bottom electrodes of stacked capacitor memory cells. Further the invention relates to methods for cleaning and drying a semiconductor wafer. The invention particularly relates to the field of wet etching a patterned hard mask layer to fabricate free standing bottom electrode structures on a semiconductor wafer and to cleaning/drying the bottom electrode structures.

BACKGROUND

The manufacturing of integrated circuits aims for continuously decreasing feature sizes of the fabricated components. For certain components, like capacitors, shrinking adversely affects the properties of the component. In order to achieve a desired value of capacitance, it is therefore necessary to keep the surface area of the capacitor above a threshold value. This is in particular important for dynamic random access memory cells (DRAM) which call for high integration densities.

As the surface area for a single memory cell decreases, the capacity of the storage capacitor decreases as well. For proper operation of the memory cell, a certain minimum capacity (typically in the order of 30 femto farad) is mandatory for the storage capacitor. If the capacity of the storage capacitor is too small, the charge stored in the storage capacitor is not sufficient to produce a detectable signal. In such a case, the information stored in the memory cell is lost and the memory cell does not operate in the desired manner.

Several concepts have been developed to overcome the problems associated with shrinking feature sizes by integrating capacitors of DRAM cells in a three dimensional manner.

A first example introduces deep trench capacitors which are formed in the substrate of a semiconductor wafer to maintain a large capacitor area with a high capacity while using only a small amount of the surface of the substrate. The selection or access transistor is usually formed on the planar surface of the substrate.

In another example, stacked capacitors are used which are formed on top of a planar surface on the substrate. The selection transistors are formed below the planar surface. The stacked capacitor comprises a first electrode and a second electrode having a dielectric layer in between. The first electrode (also called the bottom electrode) is usually formed as a cylindrical structure on the surface of the substrate by lining trenches of a patterned sacrificial mold layer with the electrode material. Afterwards, the bottom electrodes are released by etching the sacrificial mold layer. Subsequently, the surface of the, e.g., cylindrical shaped, bottom electrodes are cleaned to be prepared for further processing including disposing the dielectric layer and the second or top electrode.

However, with decreasing feature sizes of structures, etching and/or cleaning steps become increasingly difficult. Etching and/or cleaning are usually performed by wet processing. Standard wet processing, e.g. rinsing the wafer with ultra pure deionized water for cleaning purposes, introduces capillary forces between neighboring structures, i.e. between adjacent bottom electrodes. With reduced feature sizes, this may lead to adhesion of neighboring structures mediated by the cleaning liquid, usually referred to as "stiction." Stiction is primarily important during drying steps which usually follow the etching and cleaning steps in semiconductor wafer processing. There, capillary forces induced by the liquid lead to adhesion of adjacent bottom electrodes. The adjacent bottom electrodes remain stuck to each other even after being completely dried, if the adhesion force between the contacting adjacent bottom electrodes is larger than the elastic restoring force of the deformed bottom electrodes.

Additionally, exposing wafers to an air-liquid interface during transfer between etching, cleaning and drying process modules is one of the potential issues to overcome in order to obtain stiction-free process performance.

Failing to achieve stiction free process performance would ultimately result in a low yield of the produced circuits. One potential solution would be to completely avoid wet processing and perform etching steps using gas phase processing, e.g. in a hydrogen fluoride vapor. Disadvantageously, this processing leads to etching residues and to silicon surface termination states which hinders further processing.

SUMMARY

It is accordingly an object of the invention to provide a method for fabricating bottom electrodes of stacked capacitor memory cells which overcomes the above mentioned issues. It is a further object of the invention to provide a method for cleaning and drying a semiconductor wafer which overcomes the above mentioned issues. It is a particular object of the invention to achieve a processing which facilitates next processing steps by leaving a residue and interface free bottom electrode surface.

These and other objects together with technical advantages generally achieved by the present invention that provides for a method for fabricating bottom electrodes of stacked capacitor memory cells, comprising: providing a semiconductor wafer having a substrate; forming a plurality of contact plugs on the surface of the substrate; depositing a sacrificial conductive layer on the surface of the substrate and the plurality of contact plugs; depositing a mask layer on the sacrificial conductive layer; etching a plurality of trenches into the mask layer, each of the trenches being located above the contact plugs and ranging from the surface of the mask layer to the contact plugs; removing the sacrificial conductive layer above the contact plugs; depositing a second metal layer on the surface of the mask layer, the second metal layer covering the side walls of the trench and the contact plugs; removing the mask layer by wet etching; providing a wafer dryer, the wafer dryer comprising a basin filled with a cleaning liquid for rinsing the wafer and a drying area above the surface of the cleaning liquid; providing a voltage source having a first terminal and a second terminal; providing a counter electrode, the counter electrode being electrically connected to the first terminal; electrically connecting the second terminal of the voltage source to the first and second metal layer; immersing the wafer and the counter electrode into the cleaning liquid of the basin; selecting an output voltage of the voltage source; gradually withdrawing the wafer from the basin into the drying area; and removing the sacrificial conductive layer by dry etching the sacrificial conductive layer selectively to the second metal layer to form electrically isolated elements of the second metal layer serving as bottom electrodes.

According to the invention, bottom electrodes of stacked capacitor cells are formed by depositing a metal layer on the side walls of trenches within a hard mask layer, which serves as a mold for the bottom electrode structures. Prior to depositing the hard mask layer, a sacrificial conductive layer is disposed, preferably by using a first metal layer. The mask layer is wet-etched to release the bottom electrode elements as free standing structures on the semiconductor surface.

Using the conductive path provided by the first and the second metal layer, an electrostatic repulsive force between neighboring bottom electrodes is proposed to balance and/or overcome the attractive capillary forces of the liquid used for etching and cleaning hence eliminating stiction. Consequently, stiction between neighboring bottom electrodes is eliminated.

As the bottom electrode to bottom electrode distances shrink as a consequence of future device shrinkage efforts, the method according to this embodiment addresses stiction risk from Van der Waals forces as well. The method according to this embodiment is an easy to implement solution and the necessary hardware components can easily be retrofitted on existing wet benches, e.g., standard Marangoni-based wafer drying equipment.

In a particularly advantageous aspect of the invention, the step of providing the counter electrode comprises that a further semiconductor wafer is provided as the counter electrode, the further semiconductor wafer being processed identical as the semiconductor wafer but being electrically connected to the first terminal of the voltage source.

In this embodiment the through-put of the wafer dryer is increased, as two wafers can be dried at the same time.

According to another advantageous aspect, the first terminal is selected as anode and the second terminal as cathode is selected of the voltage source, the cleaning liquid of the wafer cleaner comprises water and the step of selecting the output voltage of the voltage source comprises making the potential difference between the first terminal and the second terminal sufficiently large to start electrochemical dissociation of the water of the wafer cleaner.

According to this embodiment, the conductive path of the first metal and the second metal is used as a surface of an electrically conductive capacitor element. The capacitor element is cathodically polarized in the water bath during the wafer drying process. The cathodically polarized capacitor elements act as an electron pump supplying electrons to facilitate the breakdown of water at the interface during drying. Since water is no longer thermodynamically stable at the surface of the bottom electrodes, the capillary force and the consequent risk of stiction between neighboring bottom electrode structures is eliminated.

In a further particularly advantageous aspect of the invention, the step of depositing a second metal layer on the surface of the mask layer comprises depositing the second metal layer conformably, and subsequently the following steps are performed: filling the trenches with a fill material comprising silicon oxide; removing the second metal layer on the top surface of the mask layer by chemical mechanical polishing; and removing the fill material within the trenches.

In this embodiment, the second metal layer is removed on the top surface of the mask layer by chemical mechanical polishing. The bottom electrode structures are filled with a fill material in order to eliminate the risk of second metal residues remaining in the inner part of the bottom electrode structures.

Yet another solution is provided by a method for cleaning and drying a semiconductor wafer having a plurality of protruding metallic structures, the method comprising: providing a semiconductor wafer with a plurality of protruding metallic structures, the protruding metallic structures being disposed on a surface of the semiconductor wafer; providing a sacrificial metal layer on the surface of the semiconductor wafer, the sacrificial metal layer being capable of electrically connecting the plurality of protruding metallic structures to provide an electrically conductive plate; immersing the semiconductor wafer into a cleaning liquid; polarizing the electrically conductive plate to provide a repulsive electrical field between the plurality of protruding metallic structures; gradually withdrawing the semiconductor wafer from the cleaning liquid; drying the semiconductor wafer in a drying atmosphere; and removing the sacrificial metal layer.

Yet another solution is provided by a method for cleaning and drying a semiconductor wafer having a plurality of protruding metallic structures, the method comprising: providing a semiconductor wafer with a plurality of protruding metallic structures, the protruding metallic structures being disposed on a surface of the semiconductor wafer; providing a sacrificial metal layer on the surface of the semiconductor wafer, the sacrificial metal layer being capable of electrically connecting the plurality of protruding metallic structures to provide an electrically conductive capacitor plate; immersing the semiconductor wafer into a cleaning liquid comprising water; cathodically polarizing the electrically conductive plate to act as an electron source during an electrochemical dissociation of water producing hydrogen at the surface of the conductive plate; gradually withdrawing the semiconductor wafer from the cleaning liquid; drying the semiconductor wafer in a drying atmosphere; and removing the sacrificial metal layer.

BRIEF DESCRIPTION OF THE DRAWINGS

The above features of the present invention will be more clearly understood from consideration of the following descriptions in connection with accompanying drawings in which:

FIG. 2A to 2E diagrammatically illustrate parts of a stacked capacitor DRAM-cell in a side view when applying the method steps according to the invention;

FIG. 6 is a flow chart of method steps according to an embodiment of the invention.

DETAILED DESCRIPTION OF PREFERRED EMBODIMENTS

A presently preferred embodiment of the method according to the invention is discussed in detail below. It should be appreciated, however, that the present invention provides many applicable inventive concepts that can be embodied in a wide variety of specific contexts. The specific embodiments discussed are merely illustrative of specific ways to apply the method of the invention, and do not limit the scope of the invention.

Figure 1:
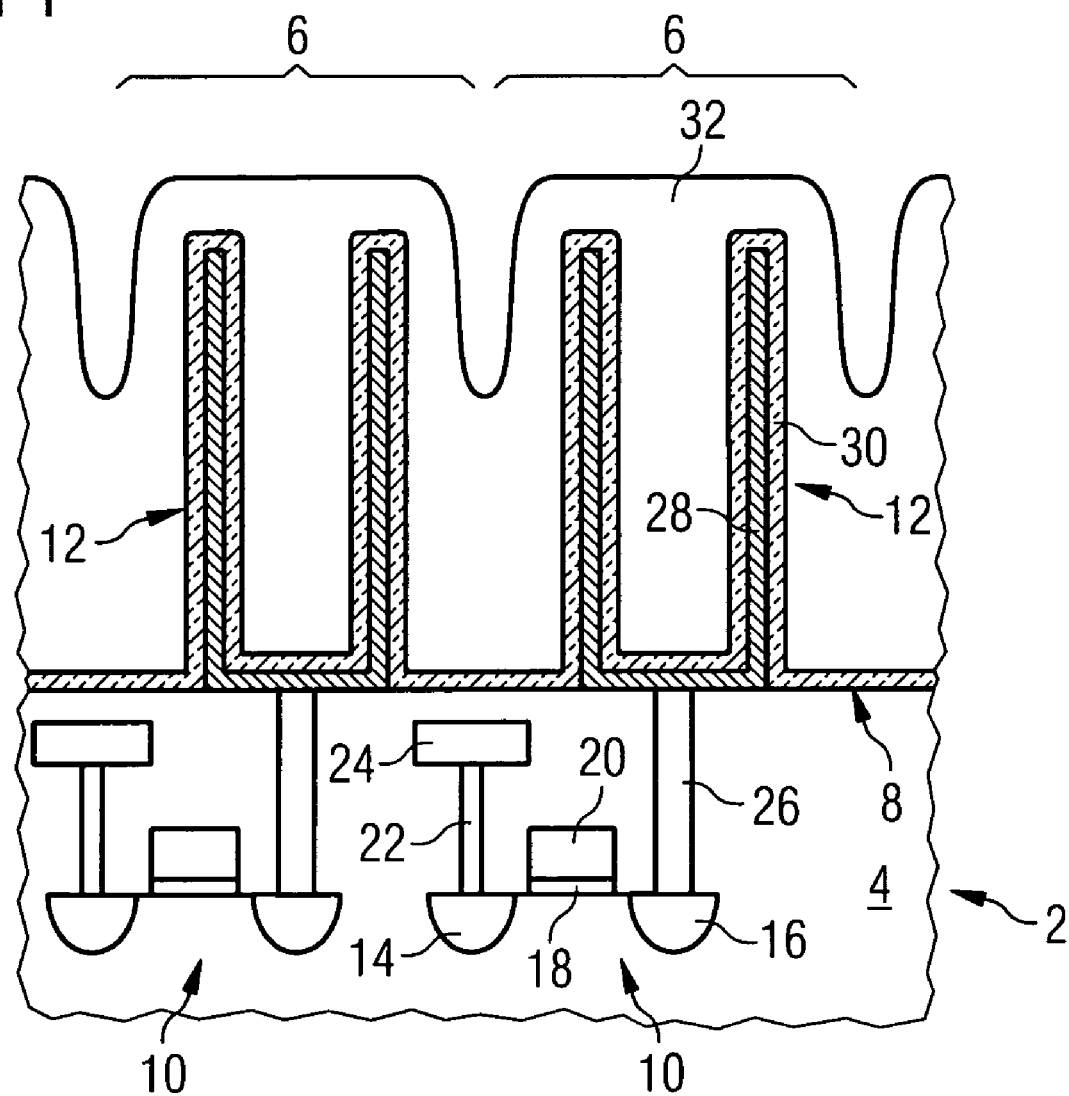
FIG. 1 diagrammatically illustrates a semiconductor wafer comprising a plurality of stacked capacitor DRAM-cells in a side view.

With respect to FIG. 1, stacked capacitor DRAM-cells are shown in a side view. It should be appreciated that FIG. 1 merely serves as an illustration of fabricating stacked capacitor DRAM-cells, i.e., the individual components shown in FIG. 1 are not necessarily to scale.

In FIG. 1, a semiconductor wafer 2 is shown comprising a substrate 4 of semi-conductive material, e.g., silicon. The semiconductor wafer 2 is used for fabricating a plurality of stacked capacitor DRAM cells 6. Each DRAM cell 6 comprises a selection transistor 10 and a stacked capacitor 12. The stacked capacitor 12 is located above the substrate surface 8.

The transistor 10 is located in the substrate 4. The transistor 10 is formed by a first junction 14 and a second junction 16. Between the first junction 14 and the second junction 16, a gate 20 is disposed above a gate dielectric layer 18. The gate 20 may comprise a stack of several layers, e.g., silicon and tungsten. The stack of several layers reduces the resistance of the gate 20. The gate 20 also serves as a word line for addressing a specific DRAM cell 6 of the plurality of DRAM cells during operation.

The first junction 14 is connected to a bitline contact 22. The bitline contact 22 is disposed above the first junction 14. The bitline contact 22 is connected to a bitline 24 which is located above the bitline contact 22. The bitline 24 serves as a write or read line during operation.

The second junction 16 is connected to a contact plug 26. The contact plug 26 is disposed above the second junction 16. The contact plug 26 serves as a connection to a bottom electrode 28 of the capacitor 12. The bottom electrode 28 of the capacitor 12 is located above the substrate surface 8.

In FIG. 1, the bottom electrodes 28 are shown in a cross sectional side view. For the three-dimensional shape of the bottom electrode 28, many different geometries can be used including cylindrical, elliptical or rectangular.

As shown in FIG. 1, the bottom electrode 28 is formed with vertical side walls above the contact plug 26. However, non vertical side walls or side walls being laterally recessed are also conceivable.

The bottom electrode 28 of the capacitor 12 is covered by a dielectric layer 30 which serves as the dielectric of capacitor 12. Above the dielectric layer 30, a top electrode 32 is disposed. The top electrode 32 of the capacitor 12 is usually common to all DRAM cells 6 thus providing a connection between adjacent DRAM cells 6.

To a person skilled in the art, it is known that other elements might be necessary to fabricate working DRAM cells 6. For example, an insulation between adjacent transistors 10 might be necessary to avoid electrical shorts to adjacent junction regions. In addition, a barrier layer between the contact plug 26 and the bottom electrode 28 may eliminate diffusion of different materials. As another example, an isolation material can be disposed around the contact plugs 26 to avoid shorts to adjacent DRAM cells 6. It is also possible to dispose the bitline 24 on top of the top electrode 32 of the capacitor 12 by using a modified bitline contact 22.

The method according to the invention provides in a first step the semiconductor wafer 2 used for fabricating the stacked capacitor DRAM cells 6. As shown in FIG. 2A, the semiconductor wafer 2 has the substrate 4. In the substrate 4, transistors 10 (not shown) have been formed for each DRAM cell 6.

In FIG. 2A, an insulation material 34 is shown on the surface 8 of the substrate 4. The insulation material 34 surrounds the side walls of the contact plugs 26, i.e., providing an electrical insulation between adjacent contact plugs 26. The insulation material 34 comprises, for example, silicon dioxide. Other suitable materials might be applied as well.

The contact plugs 26 usually have a low resistance and are made of, e.g., arsenic doped amorphous silicon. As an example, in a technology providing 70 nm minimal feature size, adjacent contact plugs 26 are spaced at a distance ranging from approximately 50 nm to 200 nm.

As shown in FIG. 2A, a first metal layer 36 is deposited on the surface 8 of the substrate 4 as a sacrificial conductive layer. The first metal layer 36 covers the insulation material 34 and the contact plugs 26. The step of depositing the first metal layer 36 includes that, e.g., titanium nitride (TiN), titanium (Ti) or tungsten (W) as materials for the first metal layer 36. It is also possible that sacrificial conductive layer could also be non-metallic, for example, comprise doped Si.

After the first metal layer 36 has been deposited, a hard mask layer 40 is deposited on the first metal layer 36. The hard mask 40 can be formed by a single layer, e.g., comprising silicate glass or silicon dioxide.

Alternatively, the mask layer 40 can be formed as a layer stack comprising a first mask layer 42 and a second mask layer 44, as shown with respect to FIG. 2B. For the first mask layer 42 boron silicate glass is deposited on the first metal layer 36. Subsequently, an undoped silicate glass is deposited on the boron silicate glass as second mask layer 44.

The layer stack or the mask layer 40 have a certain thickness which can be approximately 2 μm, e.g., for the 70 nm technology. However, other thickness values in the range of approximately 1 μm to 10 μm might also be used.

Figure 2C:
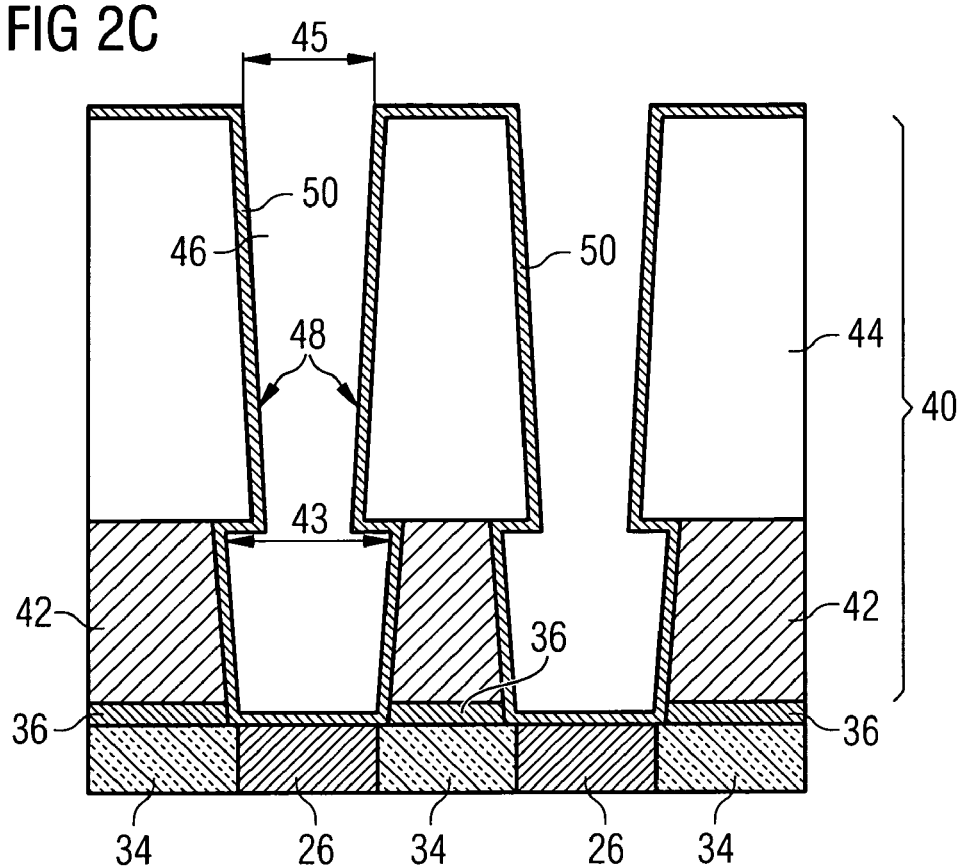

After the mask layer 40 has been formed, a plurality of trenches 46 are formed in the mask layer 40. A photo lithographic patterned resist might be applied to define the regions of the trenches 40. Each trench 46 is arranged above a respective contact plug, as shown in FIG. 2C.

The trenches 46 are etched using standard reactive ion etching techniques down to first metal layer 36 and using the wet etch selectivity between doped and undoped mask layers, 42 and 44, the bottom mask layer, 42 could be widened, as an option to increase the stability of the bottom electrode structures. The wet-etching step employs, for example, buffered hydrofluoric acid or other HF containing chemistries as an etching solution for the mask 42 dimension widening step. In the case where a single material mask layer 40 is used, the additional CD (critical dimension) widening step using HF based chemistry as described above would not be necessary.

After etching the trenches 46 into the mask layer 40, the first metal layer 36 is removed from the bottom of the trenches 46. This can be achieved by etching using the hard mask 40 as a mask to prevent etching of the first metal layer 36 outside the area of contact plugs 26. As a consequence, the bottom of the trenches 46 is now formed by the contact plugs 26.

Subsequently, a second metal layer 50 is deposited conformably on the semiconductor wafer 2. The second metal layer 50 covers the top side of the hard mask 40, the trench side walls 48, and the bottom part of the trench 46, i.e., the contact plugs 26. Depositing the second metal layer 50 includes using titanium nitride (TiN) or ruthenium (Ru) as suitable materials for the second metal layer 50.

In the next process step, the second metal layer 50 is removed from the surface of the mask layer 40.

In a first conceivable process sequence, the second metal layer 40 removed by etching using a plasma etcher.

Alternatively, the trenches 46 are filled with a fill material, e.g., silicon oxide. Subsequently, the second metal layer 50 is removed from the top surface of the mask layer 40 by chemical mechanical polishing. Then, the fill material is removed from within the trenches 40. According to these process steps, the fill material protects the inner sides of the trenches 46 from residues which could be a problem during later process steps, e.g., deposition of the dielectric layer 30.

Figure 2D:
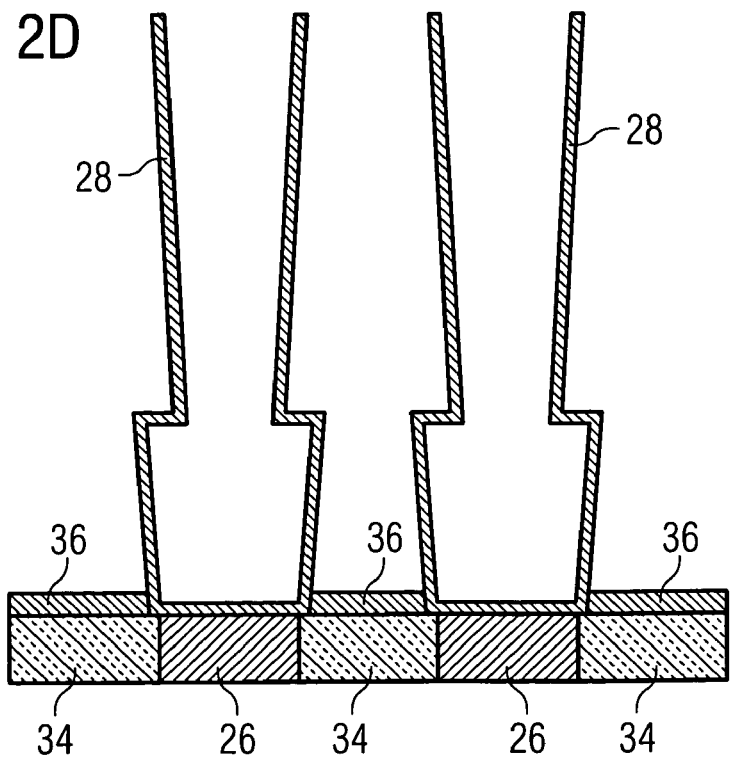

With respect to FIG. 2D, the next process step includes removing the mask layer 40. This can be performed by a further wet etching step, using buffered hydrofluoric acid or other HF containing chemistries as the etching agent. As a result, the remaining parts of the second metal layer 50 are released, thus forming the metallic bottom electrode 28.

In order to create residue and interface free bottom electrodes 28, the wafer 2 has to be cleaned and dried. Accordingly, a wafer dryer 60 is provided.

Figure 3:
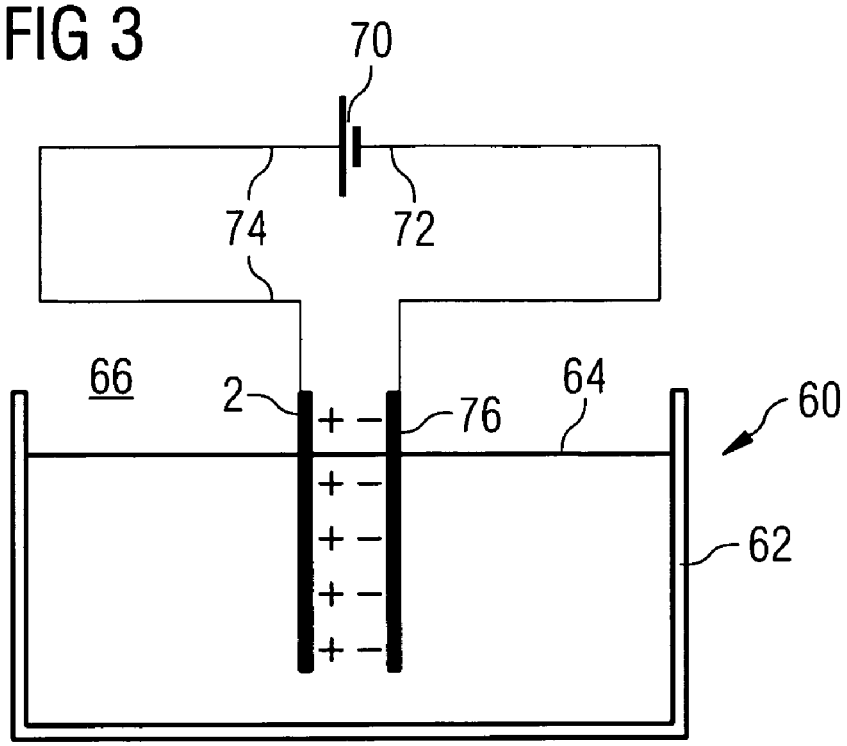
FIG. 3 diagrammatically shows a wafer drying arrangement in a side view when applying method steps according to a first embodiment of the invention.

In FIG. 3, a wafer dryer 60 is shown which is used in accordance to a first embodiment of the invention.

The wafer dryer 60 comprises a basin 62 for rinsing the wafer 2 with a cleaning liquid and a drying area 66 above the surface 64 of the cleaning liquid of the basin 62. The cleaning liquid can comprise water, including deionized water, alcoholic solutions like methanol, or a mixture between water and alcohol. The drying area 66 above the surface 64 of the cleaning liquid can comprise vapor of isopropyl alcohol and nitrogen.

In the next step, a voltage source 70 having a first terminal 72 and a second terminal 74 is provided. Furthermore, a counter electrode 76 is provided which is electrically connected to the first terminal 72.

Alternatively, a further semiconductor wafer can be provided as the counter electrode 76. The further semiconductor wafer being processed is identical as the semiconductor wafer 2, i.e., having the released metallic bottom electrodes on the surface. The further semiconductor wafer, however, is connected to the first terminal of the voltage source 70. Accordingly, two wafers can be dried at the same time. As an advantage, the throughput of the wafer dryer 60 is increased.

The drying process includes gradually withdrawing wafer 2 from the basin 62 into the drying area 66 in the presence of an electric potential between wafer 2 and a counter electrode. As previously mentioned, the counter electrode could also be the same material as wafer 2. The presence of an electric potential during wafer emersion enables the creation of a repulsive electrostatic force between neighboring bottom electrodes hence overcoming the attractive capillary forces created by the receding cleaning liquid from the wafer surface. The wafer emerging from the wafer surface is dried either as a consequence of the Marangoni effect during wafer emersion or following complete emersion by the alcohol/nitrogen atmosphere in the drying area 66 by evaporation.

After immersing the wafer 2 and the counter electrode 76 or the further semiconductor wafer 2 into the cleaning liquid of the basin 62, an output voltage of the voltage source 70 is selected. Accordingly, the bottom electrodes 28 are polarized in the basin 62 during the wafer drying process using the conductive path provided by the first metal layer 36 and the second metal layer 50.

The potential between the first terminal 72 and the second terminal 74 of voltage source 70 is chosen such that an electrostatic repulsive force between neighboring metallic bottom electrode 28 is used to balance the capillary force effects of the cleaning liquid in the basin 62. Accordingly, stiction of neighboring metallic bottom electrode is eliminated.

The necessary potential difference to be applied between the wafer 2 and the counter electrode 76 depends on the strength of the capillary forces to be overcome.

Generally, the capillary force increases with the (a) increase in the contact area of two neighboring structures, (b) decrease in the contact angle of the liquid, and (c) increase in the surface tension of the liquid. Capillary forces decrease with increase in the separation distance between the two neighboring structures.

It should be noted that according to this embodiment, the potential between wafer 2 and the counter electrode 76 is kept at a minimum such that electrostatic repulsion between neighboring bottom electrodes 28, is sufficient to overcome capillary force induced stiction forces between them. In this arrangement, the current flow between the electrodes is expected to be very low, presumably below 1 micro ampere.

Figure 2E:
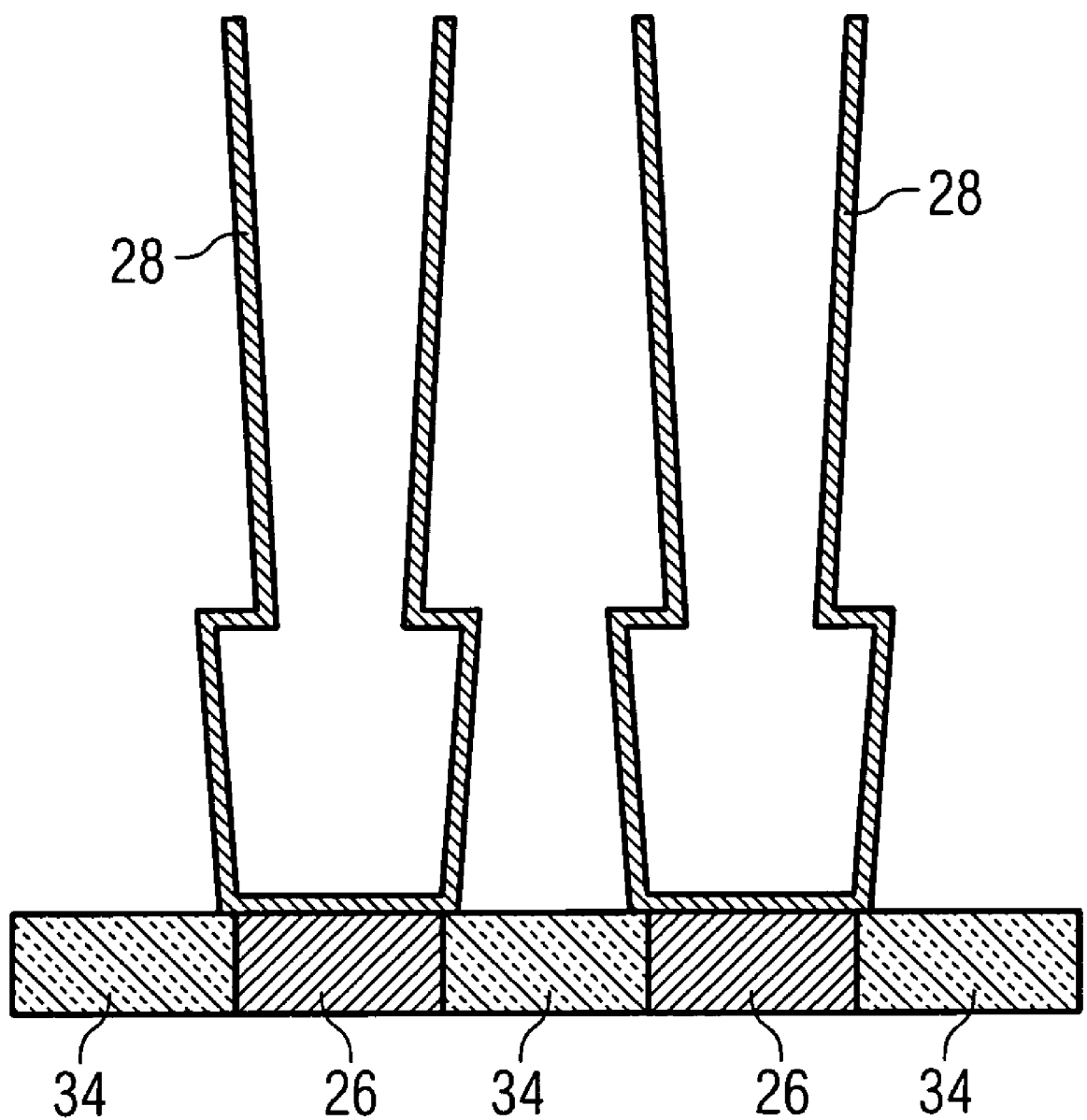

After wafer drying, a dry etching step is performed to remove the first metal layer 36, as shown in FIG. 2E. The dry etching step etches the first metal layer 36 selectively to the second metal layer 50 to form electrically isolated structures of the electrodes 28.

Figure 4:
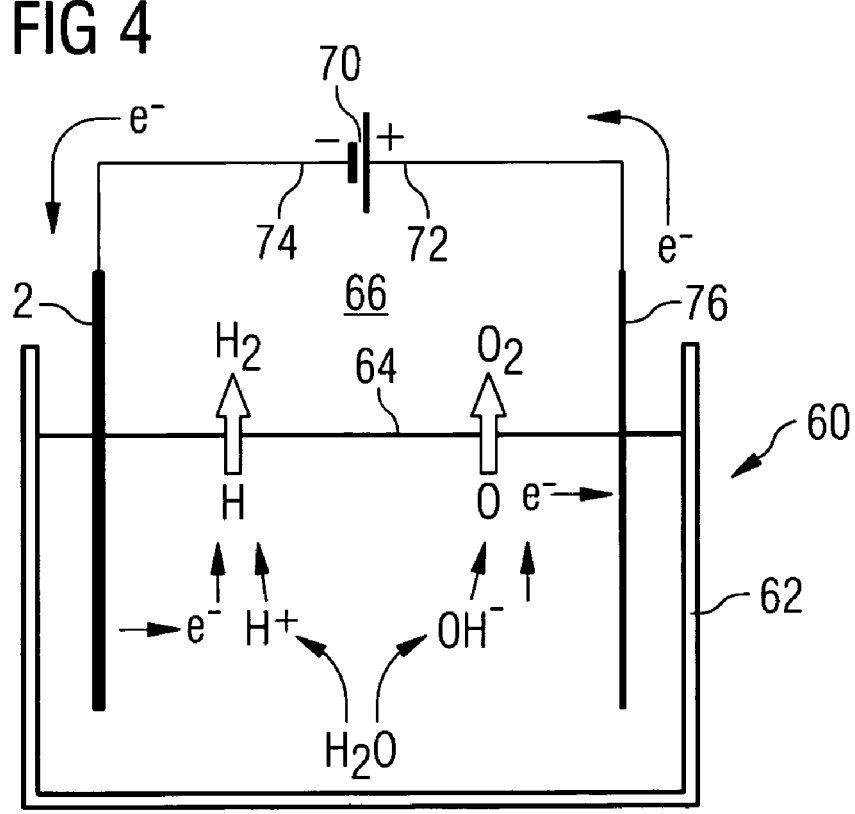
FIG. 4 diagrammatically shows a wafer drying arrangement in a side view when applying method steps according to a second embodiment of the invention.

Now referring to FIG. 4, a second embodiment of the inventive method is described. The difference from the first embodiment is that a different wafer dryer 60 is provided. In the following, only the drying of the wafer 2 is described. Further processing steps, which were explained with respect to FIGS. 2A to 2E, are omitted for simplicity.

Again, the wafer dryer 60 comprises a basin 62 for rinsing the wafer 2 with a cleaning liquid and a drying area 66 above the surface 64 of the cleaning liquid of the basin 62. According to this embodiment, the cleaning liquid comprises deionized water. The drying area 66 above the surface 64 of the cleaning liquid can comprise vapor of isopropyl alcohol and nitrogen, i.e., employing standard Marangoni drying techniques.

In the next step, a voltage source 70 having a first terminal 72 and a second terminal 74 is provided. According to this embodiment, the first terminal is the anode terminal of voltage source 70, and the second terminal is the cathode terminal of voltage source 70. Furthermore, a counter electrode 76 is provided which is electrically connected to the anode terminal 72.

After immersing the wafer 2 and the counter electrode 76 or the further semiconductor wafer 2 into the cleaning liquid of the basin 62, an output voltage of the voltage source 70 is selected. Accordingly, the bottom electrodes 28 are polarized in the basin 62 during the wafer drying process using the conductive path provided by the first metal layer 36 and the second metal layer 50.

The potential between the anode 72 and the cathode 74 of voltage source 70 is chosen higher as compared to the first embodiment. In this case, the cathodically polarized capacitor structures 28 act as an electron pump supplying the electrons to facilitate the breakdown of water at the interface during drying. Since water is no longer thermodynamically stable at the surface of the bottom electrodes 28, the capillary force and the consequent risk of stiction between neighboring bottom electrode structures 28 is eliminated. Accordingly, stiction of neighboring cylinders is eliminated.

The necessary potential difference to be applied between anode 72 and cathode 74 is a material property of water, and the electrode materials sustaining the electrochemical reactions. In this embodiment, the potential difference between the electrodes is such that visible evolution of $H_2$ is observed at the cathode and $O_2$ at the anode.

In this case, potential difference between the anode 72 and the cathode 74 is approximately independent of the strength of the capillary forces, as their influence is greatly reduced due to the elimination of the wet interface.

As in the previous embodiment, the drying process includes gradually withdrawing the wafer 2 from the basin 62 into the drying region 66. The wafers are dried by evaporation in an atmosphere of alcohol and nitrogen in the drying region 66.

Figure 5A:
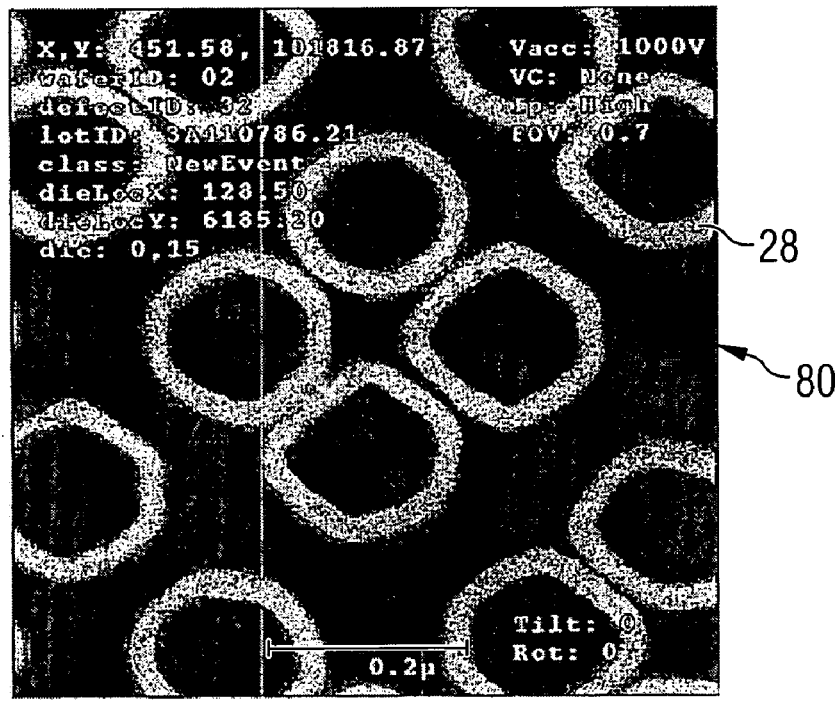
FIG. 5A to 5C illustrate a plurality of bottom electrodes of stacked capacitor DRAM-cells after applying prior art wet etching techniques.
Figure 5B:
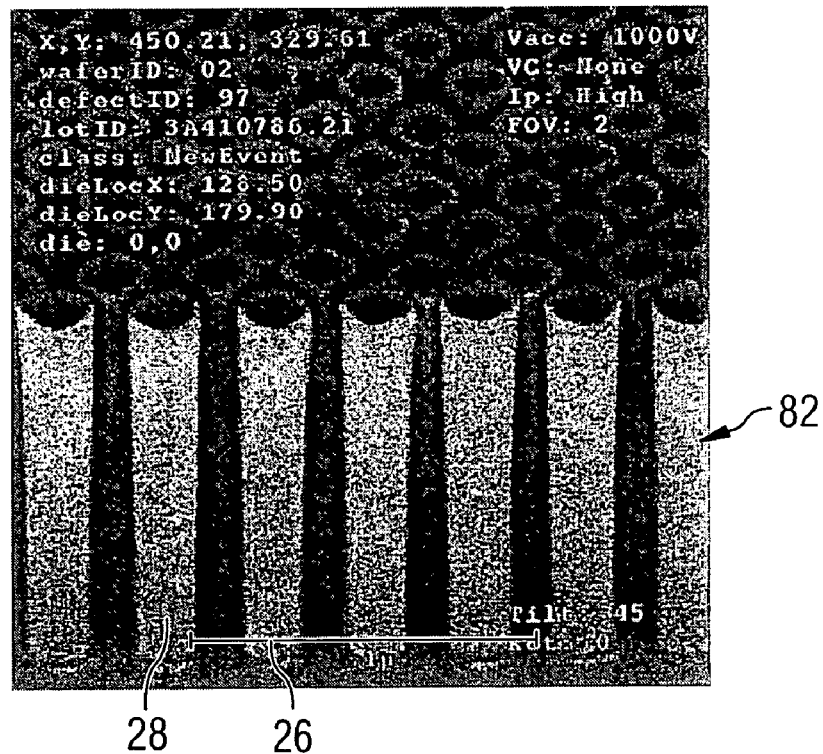
Figure 5C:
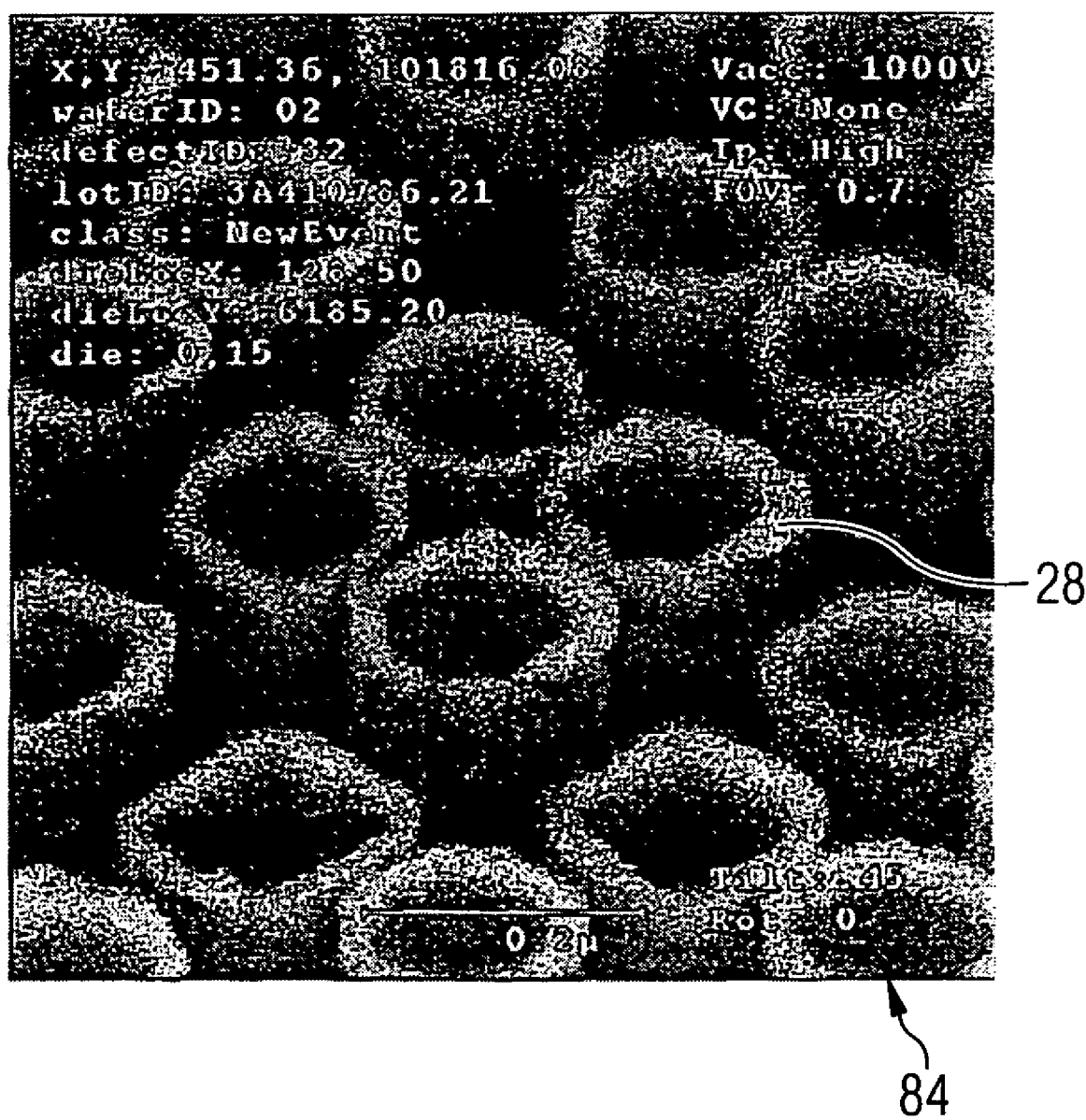

Referring now to FIGS. 5A to 5C, bottom electrodes 28 of stacked capacitor DRAM-cells are shown which are fabricated by applying prior art wet etching and drying techniques.

In FIG. 5A, a first SEM-picture 80 shows bottom electrodes 28 of stacked capacitor DRAM-cells in a top view. In FIG. 5B, a second SEM-picture 82 shows bottom electrodes 28 of stacked capacitor DRAM-cells in a side view. In FIG. 5C, a third SEM-picture 84 shows an enlarged view of the bottom electrodes 28 of FIG. 5C. The stiction between the four neighboring cylinders of bottom electrodes 28 in the center of the first SEM-picture 80 is clearly visible.

Referring now to FIG. 6, in step 100 a semiconductor wafer with a plurality of protruding metallic structures is provided. The protruding metallic structures are disposed on a surface of the semiconductor wafer and can be formed by bottom electrodes of stacked capacitor DRAM cells.

In step 102, a sacrificial metal layer is provided on the surface of the semiconductor wafer. The sacrificial metal layer is capable of electrically connecting the plurality of protruding metallic structures to provide an electrically conductive plate.

In step 104, the semiconductor wafer is immersed into a cleaning liquid.

In step 106, the electrically conductive plate is polarized to provide a repulsive electrical field between the plurality of protruding metallic structures.

In step 108, the semiconductor wafer is gradually withdrawn from the cleaning liquid.

In step 110, the semiconductor wafer is dried in a drying atmosphere.

In step 112, the sacrificial metal layer is removed.

Figure 7:
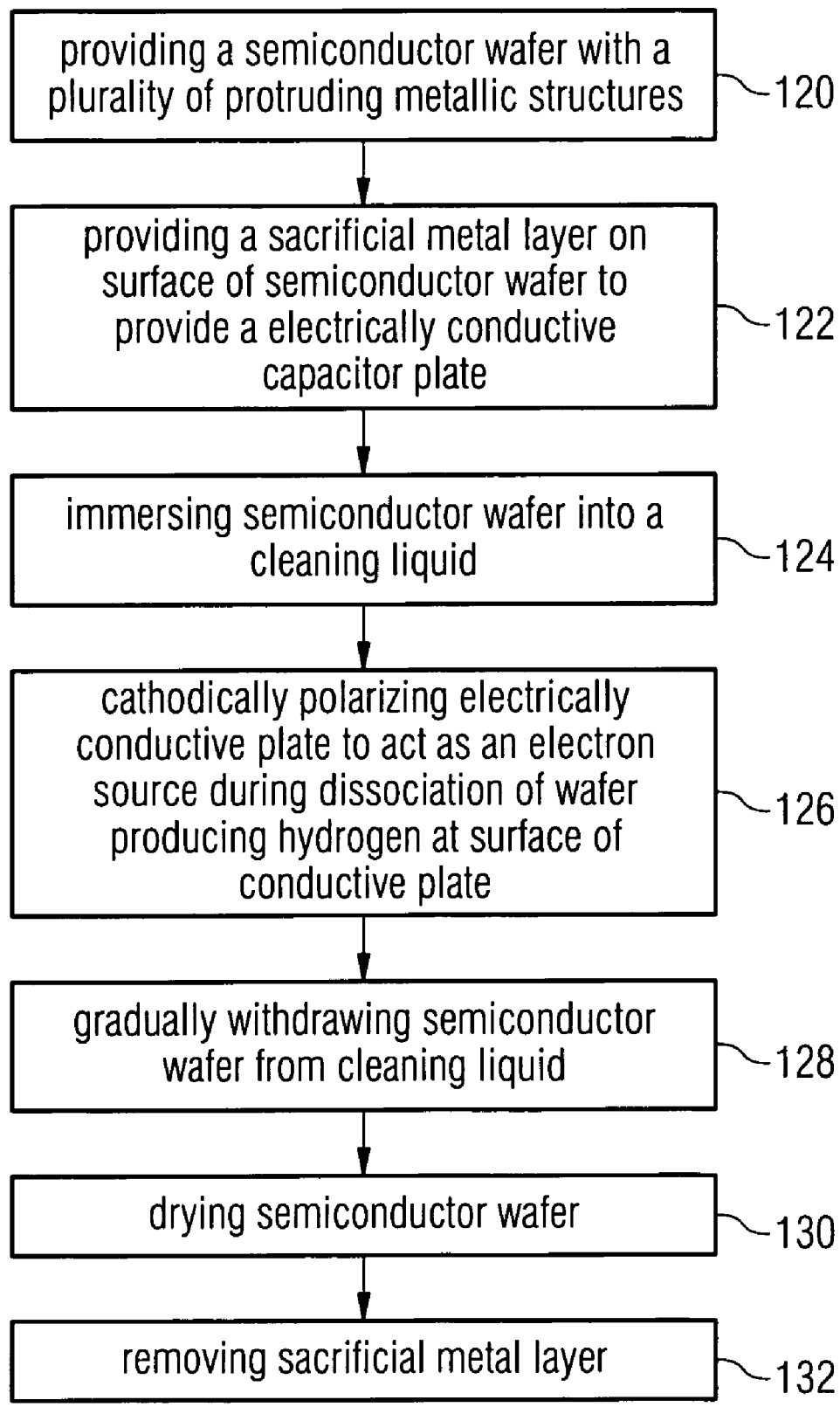
FIG. 7 is a flow chart of method steps according to another embodiment of the invention.

Referring now to FIG. 7, in step 120, a semiconductor wafer with a plurality of protruding metallic structures is provided. The protruding metallic structures are disposed on a surface of the semiconductor wafer and can be formed by bottom electrodes of stacked capacitor DRAM cells.

In step 122, a sacrificial metal layer is provided on the surface of the semiconductor wafer. The sacrificial metal layer is capable of electrically connecting the plurality of protruding metallic structures to provide an electrically conductive capacitor plate.

In step 124, the semiconductor wafer is immersed into a cleaning liquid comprising water.

In step 126, the electrically conductive plate is cathodically polarized to act as an electron source during an electrochemical dissociation of water producing hydrogen at the surface of the conductive plate.

In step 128, the semiconductor wafer is gradually withdrawn from the cleaning liquid.

In step 130, the semiconductor wafer is dried in a drying atmosphere.

In step 132, the sacrificial metal layer is removed.

Having described embodiments for a method and an arrangement for stiction free drying of free standing semiconductor structures, it is noted that modifications and variations can be made by persons skilled in the art in light of the above teachings. It is therefore to be understood that changes may be made in the particular embodiments of the invention disclosed which are within the scope and spirit of the invention as defined by the appended claims.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE NUMERALS 2 wafer
4 substrate
6 DRAM cell
8 substrate surface
10 transistor
12 capacitor
14 first junction
16 second junction
18 gate dielectric layer
20 gate
22 bitline contact
24 bitline
26 contact plug
28 bottom electrode
30 dielectric layer
32 top electrode
34 insulation
36 first metal layer
40 hard mask
42 first mask layer
43 first width
44 second mask layer
45 second width
46 trench
48 trench sidewall
50 second metal layer
60 wafer dryer
62 basin
64 cleaning liquid surface
66 drying area
70 voltage source
72 first terminal
74 second terminal
76 counter electrode
80 first SEM picture
82 second SEM picture
84 third SEM picture
100–132 process steps

What is claimed is:

1. A method for fabricating bottom electrodes of stacked capacitor memory cells, comprising:
   providing a semiconductor wafer having a substrate;
   forming a plurality of contact plugs on the surface of the substrate;
   depositing a sacrificial conductive layer on the surface of the substrate and the plurality of contact plugs;
   depositing a mask layer on the sacrificial conductive layer;

etching a plurality of trenches into the mask layer, each of the trenches being located above the contact plugs and ranging from the surface of the mask layer to the contact plugs;

removing the sacrificial conductive layer above the contact plugs;

depositing a metal layer on the surface of the mask layer, the metal layer covering the side walls of the trench and the contact plugs;

removing the mask layer by wet etching;

providing a wafer dryer, the wafer dryer comprising a basin filled with a cleaning liquid for rinsing the wafer and a drying area above the surface of the cleaning liquid;

providing a voltage source having a first terminal and a second terminal;

providing a counter electrode, the counter electrode being electrically connected to the first terminal;

electrically connecting the second terminal of the voltage source to the sacrificial conductive layer and metal layer;

immersing the wafer and the counter electrode into the cleaning liquid of the basin;

selecting an output voltage of the voltage source;

gradually withdrawing the wafer from the basin into the drying area; and removing the sacrificial conductive layer by dry etching the sacrificial conductive layer selectively to the metal layer to form electrically isolated elements of the metal layer serving as bottom electrodes.

2. The method according to claim 1, wherein the potential difference between the electrodes is designed such that electrostatic repulsion between the neighboring bottom electrodes is sufficient to overcome the capillary forces between the neighboring bottom electrodes.

3. The method according to claim 1, wherein providing a wafer dryer comprises selecting the cleaning liquid from the group consisting of: deionized water, methanol and water/alcohol-mixtures.

4. The method according to claim 1, wherein providing the counter electrode comprises providing a further semiconductor wafer as the counter electrode, the further semiconductor wafer being processed identically to the semiconductor wafer but being electrically connected to the first terminal of the voltage source.

5. The method according to claim 1, wherein the first terminal is selected as an anode and the second terminal is selected as a cathode of the voltage source;

the cleaning liquid of the wafer cleaner comprises water; and selecting the output voltage of the voltage source comprises making the potential difference between the first terminal and the second terminal sufficiently large to start electrochemical dissociation of the water of the wafer cleaner.

6. The method according to claim 1, wherein depositing the sacrificial conductive layer comprises depositing titanium nitride, titanium or tungsten.

7. The method according to claim 1, wherein depositing the sacrificial conductive layer comprises depositing a non metallic layer for achieving electrical continuity across the wafer.

8. The method according to claim 1, wherein depositing the metal layer comprises using TiN or Ru.

9. The method according to claim 1, wherein depositing a mask layer comprises depositing a silicate glass or oxide as the mask layer.

10. The method according to claim 1, wherein depositing the mask layer comprises depositing a boron silicate glass on the sacrificial conductive layer and depositing an undoped silicate glass on the boron silicate glass.

11. The method according to claim 1, wherein etching the sacrificial conductive layer selectively to the metal layer comprises employing plasma etching techniques using a chemistry which depends on the materials chosen for the bottom electrode and the sacrificial conductive layer.

12. The method according to claim 1, wherein after etching a plurality of trenches into the mask layer, the sacrificial conductive layer is etched using the mask layer as a mask to remove the sacrificial conductive layer above the contact plugs.

13. The method according to claim 1, wherein depositing the metal layer on the surface of the mask layer comprises depositing the metal layer conformably and subsequently performing the following:

filling the trenches with a fill material comprising silicon oxide;

removing the metal layer on the top surface of the mask layer by chemical mechanical polishing; and removing the fill material within the trenches.

14. The method according to claim 1, wherein depositing the metal layer on the surface of the mask layer comprises depositing the metal layer conformably and removing the metal layer on the top surface of the mask layer by etching using a plasma etcher.

15. The method according to claim 1, wherein the drying volume above the water surface comprises vapor of isopropyl alcohol and nitrogen.

16. The method according to claim 15, wherein gradually withdrawing the wafer from the basin leaves the emerging wafer surface free of moisture due to the gradient of surface tension such that cleaning liquid from the surface of the wafer is pulled back into the body of the cleaning liquid.

17. The method according to claim 1, wherein arranging a plurality of contact plugs on the surface of the substrate comprises using arsenic doped amorphous silicon for the contact plugs.

18. The method according to claim 1, wherein arranging a plurality of contact plugs on the surface of the substrate comprises spacing adjacent contact plugs at a distance ranging from 50 nm to 200 nm.

19. The method according to claim 1, wherein the mask layer has a thickness in the range of 1 μm to 10 μm.

20. The method according to claim 1, wherein each trench has a width in the range of 50 nm to 200 nm.

21. The method according to claim 1, wherein the sacrificial conductive layer comprises a first metal layer, and said metal layer comprises a second metal layer.

* * * * *